(12) United States Patent
Kang et al.

(10) Patent No.: US 8,048,784 B2
(45) Date of Patent: Nov. 1, 2011

(54) METHODS OF MANUFACTURING SEMICONDUCTOR DEVICES INCLUDING A DOPED SILICON LAYER

(75) Inventors: Pil-Kyu Kang, Gyeonggi-do (KR); Yong-Hoon Son, Gyeonggi-do (KR); Jong-Wook Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 320 days.

(21) Appl. No.: 12/284,565

(22) Filed: Sep. 23, 2008

(65) Prior Publication Data

US 2009/0104759 A1 Apr. 23, 2009

(30) Foreign Application Priority Data

Oct. 17, 2007 (KR) .................. 10-2007-0104314

(51) Int. Cl.
*H01L 21/36* (2006.01)

(52) U.S. Cl. ........ 438/487; 438/766; 438/480; 438/502; 438/166; 438/306; 257/E21.09; 257/E21.134; 257/E21.347; 257/795; 257/72; 257/73; 257/74

(58) Field of Classification Search .................. 438/487, 438/766, 480, 502, 166, 306; 257/E21.09, 257/E21.134, E21.347, 795, 72–74, E29.003, 257/E21.412
See application file for complete search history.

(56) References Cited

U.S. PATENT DOCUMENTS

| | | | | |
|---|---|---|---|---|
| 4,489,478 A * | 12/1984 | Sakurai | ............................ | 438/18 |
| 5,639,698 A * | 6/1997 | Yamazaki et al. | ............ | 438/486 |
| 5,879,447 A * | 3/1999 | Okada et al. | ...................... | 117/8 |
| 5,972,105 A * | 10/1999 | Yamazaki et al. | ................ | 117/8 |
| 6,015,753 A * | 1/2000 | Lin et al. | ....................... | 438/682 |
| 6,083,779 A * | 7/2000 | Seo | ............................... | 438/158 |
| 6,288,435 B1 * | 9/2001 | Mei et al. | ....................... | 257/458 |
| 6,482,684 B1 * | 11/2002 | Yamazaki | ..................... | 438/158 |
| 6,844,248 B2 * | 1/2005 | Naseem et al. | ............... | 438/486 |
| 7,001,829 B1 * | 2/2006 | Yamazaki | ..................... | 438/479 |
| 7,012,026 B2 * | 3/2006 | Emili et al. | .................... | 438/706 |
| 7,186,601 B2 * | 3/2007 | Fukunaga et al. | ............ | 438/166 |
| 7,271,041 B2 * | 9/2007 | Takahashi | ..................... | 438/151 |
| 7,368,335 B2 * | 5/2008 | Asami et al. | .................. | 438/150 |
| 7,396,744 B2 * | 7/2008 | Son et al. | ...................... | 438/482 |
| 7,419,860 B2 * | 9/2008 | Shinagawa et al. | ........... | 438/166 |
| 7,459,353 B2 * | 12/2008 | Son et al. | ....................... | 438/151 |
| 2001/0051416 A1 * | 12/2001 | Yamazaki et al. | ............ | 438/487 |
| 2002/0055208 A1 * | 5/2002 | Ohtani et al. | ................. | 438/151 |
| 2002/0197778 A1 * | 12/2002 | Kasahara et al. | ............. | 438/166 |
| 2003/0027380 A1 * | 2/2003 | Yamazaki | ..................... | 438/151 |
| 2003/0059991 A1 * | 3/2003 | Teramoto et al. | ............. | 438/166 |

(Continued)

FOREIGN PATENT DOCUMENTS

JP H09-45617 2/1997

(Continued)

*Primary Examiner* — N Drew Richards
*Assistant Examiner* — Ankush K Singal
(74) *Attorney, Agent, or Firm* — Myers Bigel Sibley & Sajovec

(57) ABSTRACT

Methods for manufacturing a semiconductor device include forming a seed layer containing a silicon material on a substrate. An amorphous silicon layer containing amorphous silicon material is formed on the seed layer. The amorphous silicon layer is doped with an impurity. A laser beam is irradiated onto the amorphous silicon layer to produce a phase change of the amorphous silicon layer and change the amorphous silicon layer into a single-crystal silicon layer based on the seed layer.

21 Claims, 10 Drawing Sheets

U.S. PATENT DOCUMENTS

| | | | |
|---|---|---|---|
| 2003/0067037 A1* | 4/2003 | Lu et al. | 257/347 |
| 2003/0160239 A1* | 8/2003 | Shinagawa et al. | 257/64 |
| 2004/0014261 A1* | 1/2004 | Takahashi | 438/149 |
| 2004/0018672 A1* | 1/2004 | Bohr | 438/166 |
| 2004/0180518 A1* | 9/2004 | Chang et al. | 438/487 |
| 2005/0145926 A1* | 7/2005 | Lee | 257/316 |
| 2005/0191796 A1* | 9/2005 | Takahashi | 438/151 |
| 2005/0277235 A1* | 12/2005 | Son et al. | 438/166 |
| 2006/0246638 A1* | 11/2006 | Asami et al. | 438/150 |
| 2006/0267100 A1* | 11/2006 | Noguchi et al. | 257/351 |
| 2007/0054478 A1* | 3/2007 | Tsao | 438/487 |
| 2007/0085090 A1* | 4/2007 | Kim et al. | 257/83 |
| 2007/0117282 A1* | 5/2007 | Saito et al. | 438/149 |
| 2007/0224789 A1* | 9/2007 | Kang et al. | 438/487 |
| 2008/0023704 A1* | 1/2008 | Noda et al. | 257/72 |
| 2008/0157095 A1* | 7/2008 | Son et al. | 257/74 |
| 2009/0026970 A1* | 1/2009 | Ohtani | 315/169.3 |

FOREIGN PATENT DOCUMENTS

| | | |
|---|---|---|
| JP | 2003-218362 | 1/2003 |
| KR | 10-0681262 | 2/2007 |

* cited by examiner

METHODS OF MANUFACTURING SEMICONDUCTOR DEVICES INCLUDING A DOPED SILICON LAYER

CROSS REFERENCE TO RELATED APPLICATIONS

This application is related to and claims priority under 35 U.S.C. §119 from Korean Patent Application 10-2007-0104314, filed on Oct. 17, 2007, the entire contents of which are hereby incorporated by reference.

BACKGROUND OF THE INVENTION

The present invention relates to semiconductor (integrated circuit) devices, and more particularly, to methods of manufacturing a semiconductor device including doping a silicon layer.

In general, semiconductor materials may be classified as single crystal, polycrystal and amorphous. A single crystal material is a material formed of a one crystal structure, a polycrystal material is a material formed to have a multicrystal structure, and an amorphous material is a material formed of an irregular atom array, not a crystal structure.

A polycrystal generally has plural crystal structure with many grain boundaries. Such grain boundaries may interfere with movement and control of carriers, such as an electron, a hole or the like As such, an electrical characteristic if such a structure may be degraded.

A single crystal has a single crystal structure that generally has almost no grain boundary. Thus, this structure may not influence the movement and control of carriers and may provide improved electrical characteristic as compared with the polycrystal structure. In a semiconductor device including a thin film transistor (TFT) or the like having a stack structure and/or in a semiconductor device including a multilayer structure, such as a system on chip (SOC) or the like, a channel layer may be formed of single crystal material, and a single-crystal silicon thin film is generally used as a thin film to form the active area.

A method for forming a single-crystal silicon thin film is described in U.S. Pat. No. 5,972,105.

In some known methods of forming a single crystal thin film, an insulation layer pattern having an opening is formed on a single crystal substrate and a seed thin film of single crystal structure is formed in the opening through a selective epitaxial growth. An amorphous silicon thin film is then formed on the insulation layer pattern having the seed thin film and a heat treatment is performed on the amorphous silicon thin film. As a result, the amorphous silicon thin film has a phase change from the heat treatment, which changes the amorphous silicon thin film into a single-crystal silicon thin film.

The heat treatment is generally performed using a laser beam. The laser beam is projected onto the amorphous silicon thin film to heat the amorphous silicon thin film and change the amorphous silicon thin film into a single-crystal silicon thin film through a phase change. This may be referred to as laser induced epitaxial growth (LEG).

When a laser beam is irradiated onto the amorphous silicon thin film, protrusions are typically formed on the surface of the silicon at a crystallizing time, as a result of which an ablation defect, where a thickness of the thin film becomes excessively thinned, may occur between the protrusions.

FIG. 1 illustrates an image of an ablation defect measured on the surface of a single-crystal silicon thin film formed using conventional LEG. As shown in FIG. 1, the ablation defect of excessively thinned film is formed on the silicon thin film crystallized by the LEG. In such an ablation defect portion, a state of face is not even and devices typically cannot be formed thereon. Further, in forming the device, a defect may occur and a rapid drop of yield may be caused. Thus, both an increase of error occurrences on products may be caused and productivity may be lowered.

SUMMARY OF EMBODIMENTS OF THE INVENTION

In some embodiments, methods for manufacturing a semiconductor device include forming a seed layer containing a silicon material on a substrate. An amorphous silicon layer containing amorphous silicon material is formed on the seed layer. The amorphous silicon layer is doped with an impurity. A laser beam is irradiated onto the amorphous silicon layer to produce a phase change of the amorphous silicon layer and change the amorphous silicon layer into a single-crystal silicon layer based on the seed layer.

In further embodiments, forming the seed layer includes forming the seed layer through a selective epitaxial growth process and doping the amorphous silicon layer with an impurity includes doping the amorphous silicon layer through an ion implantation on an upper face of the amorphous silicon layer. The selective epitaxial growth process may be vapor phase epitaxy. Forming the seed layer includes forming the seed layer of a single single-crystal silicon material and doping the amorphous silicon layer includes doping the amorphous silicon layer with Ge. The amorphous silicon layer may be a polysilicon.

In other embodiments, irradiating a laser beam onto the doped amorphous silicon layer includes heating the substrate including the seed layer and the doped amorphous silicon layer to a temperature of about 350° C. to about 450° C. while irradiating the laser beam onto the doped amorphous silicon layer. Doping the amorphous silicon layer may include doping the amorphous silicon layer with Ge, As and/or P.

In further embodiments, methods for manufacturing a semiconductor device include providing a single-crystal silicon substrate and forming an insulation layer on the single-crystal silicon substrate. The insulation layer includes a contact hole exposing a surface of the single-crystal silicon substrate. A seed contact containing a silicon material is formed in the contact hole. An amorphous silicon layer containing an amorphous silicon material is formed on an upper face of the insulation layer including the seed contact. The amorphous silicon layer is doped with an impurity. A laser beam is irradiated onto the doped amorphous silicon layer to provide a phase change of the amorphous silicon layer and change the amorphous silicon layer into a single-crystal silicon layer.

In other embodiments, forming the seed contact includes forming the seed contact through a selective epitaxial growth process and doping the amorphous silicon layer with an impurity includes doping the amorphous silicon layer through an ion implantation on an upper face of the amorphous silicon layer. The selective epitaxial growth process may be vapor phase epitaxy. Doping the amorphous silicon layer may include doping the amorphous silicon layer with Ge. The amorphous silicon layer may be a polysilicon and irradiating a laser beam onto the doped amorphous silicon layer may include heating the substrate including the seed layer and the doped amorphous silicon layer to a temperature of about 350° C. to about 450° C. while irradiating the laser beam onto the doped amorphous silicon layer.

In further embodiments, forming the insulation layer is preceded by forming an electrical device on the single-crystal silicon substrate. The method further includes forming an upper electrical device on the first single-crystal silicon layer and forming a second insulation layer on the first single-crystal silicon layer including the upper electrical device. A contact hole is formed in the second insulation layer that exposes an upper surface of the first single-crystal silicon layer. A second seed contact containing a silicon material is formed in the contact hole in the second insulation layer through a selective epitaxial growth process. A second amorphous silicon layer containing an amorphous silicon material is formed on an upper face of the second insulation layer including the second seed contact. The second amorphous silicon layer is doped with an impurity through an ion implantation of doping impurity on an upper face of the second amorphous silicon layer. A laser beam is irradiated onto the doped second amorphous silicon layer to provide a phase change of the second amorphous silicon layer and change the second amorphous silicon layer into a second single-crystal silicon layer.

In other embodiments, the selective epitaxial growth process is vapor phase epitaxy. Forming the second seed layer may include forming the second seed layer of a single single-crystal silicon material and doping the second amorphous silicon layer may include doping the second amorphous silicon layer with Ge. The second amorphous silicon layer may be a polysilicon. Irradiating a laser beam onto the doped second amorphous silicon layer may include heating the substrate including the second seed layer and the second doped amorphous silicon layer to a temperature of about 350° C. to about 450° C. while irradiating the laser beam onto the second doped amorphous silicon layer. Irradiating a laser beam onto the doped second amorphous silicon layer may include heating the substrate including the second seed layer and the second doped amorphous silicon layer to a temperature of about 400° C. while irradiating the laser beam onto the second doped amorphous silicon layer. Irradiating a laser beam may include scanning the second doped amorphous silicon layer horizontally. The second amorphous silicon layer may be doped with Ge, As and/or P.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF EMBODIMENTS

Figure 1:
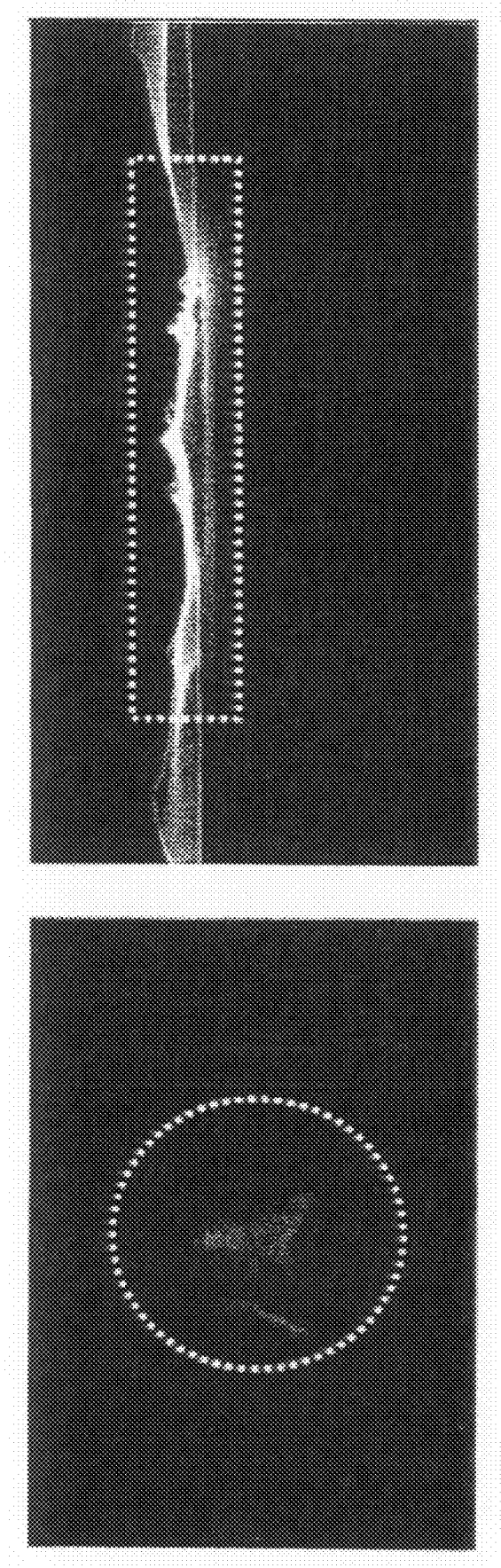
FIG. 1 illustrates an SEM photo image of an ablation defect on the surface of a single-crystal silicon thin film formed using LEG according to the prior art.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present invention now will be described more fully hereinafter with reference to FIGS. 2 to 4. FIGS. 2A to 2F are enlarged cross sectional views of a portion of a semiconductor device illustrating a method of manufacturing a semiconductor device according to some embodiments of the invention.

Figure 2A:
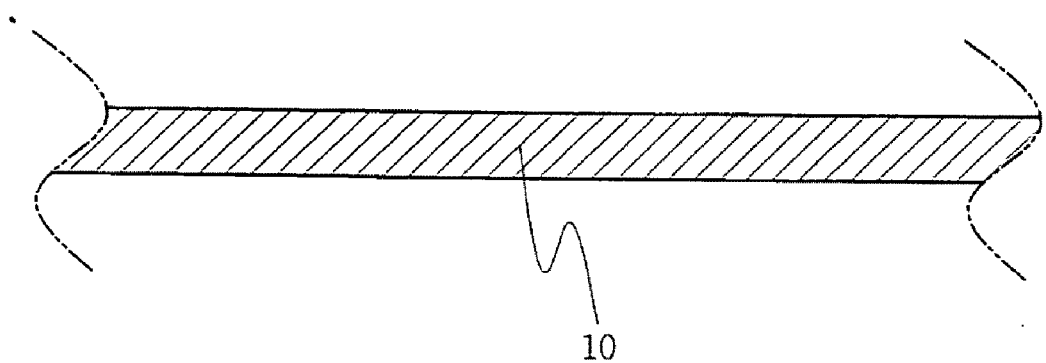
FIGS. 2A to 2F are cross sectional views of a semiconductor device illustrating methods of manufacturing a semiconductor device according to some embodiments of the present invention.
Figure 2B:
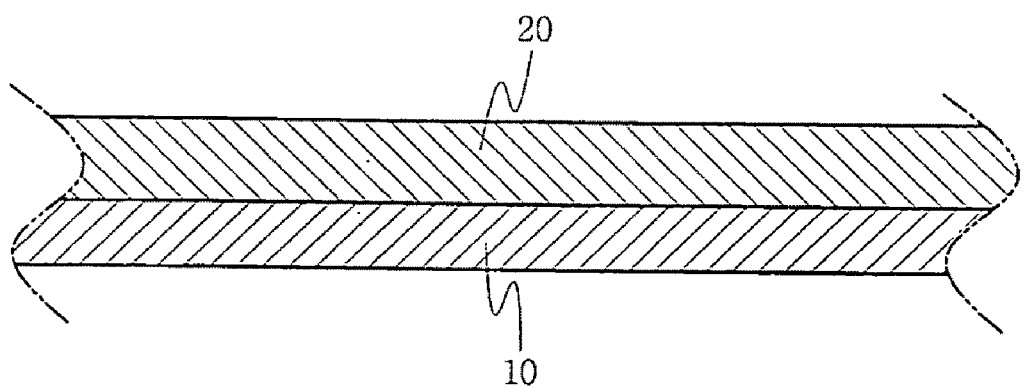

Referring to the embodiments of FIGS. 2A and 2B, a seed layer 10 is formed. The seed layer 10 includes silicon material. For example, the seed layer 10 may be formed through a selective epitaxial growth process in some embodiments. The selective epitaxial growth may include, liquid phase epitaxy, vapor phase epitaxy, molecular beam epitaxy and/or the like. Selective epitaxial growth using vapor phase epitaxy is used to form the seed layer 10 in particular embodiments.

The seed layer 10 may be a single-crystal silicon layer or single crystal germanium layer. The seed layer 10 may be a single-crystal silicon layer obtained through selective epitaxial growth or a single crystal germanium layer and silicon-on-insulator layer or germanium-on-insulator layer obtained through selective epitaxial growth in some embodiments.

As shown in FIG. 2B, an amorphous silicon layer 20 formed of an amorphous silicon material is formed on the seed layer 10. The amorphous silicon layer 20 may be formed, for example, through chemical vapor deposition (CVD). In some embodiments, the amorphous silicon layer 20 may have a thickness of about 500 Å to about 1000 Å. The amorphous silicon layer 20 may be formed of polysilicon.

Figure 2C:
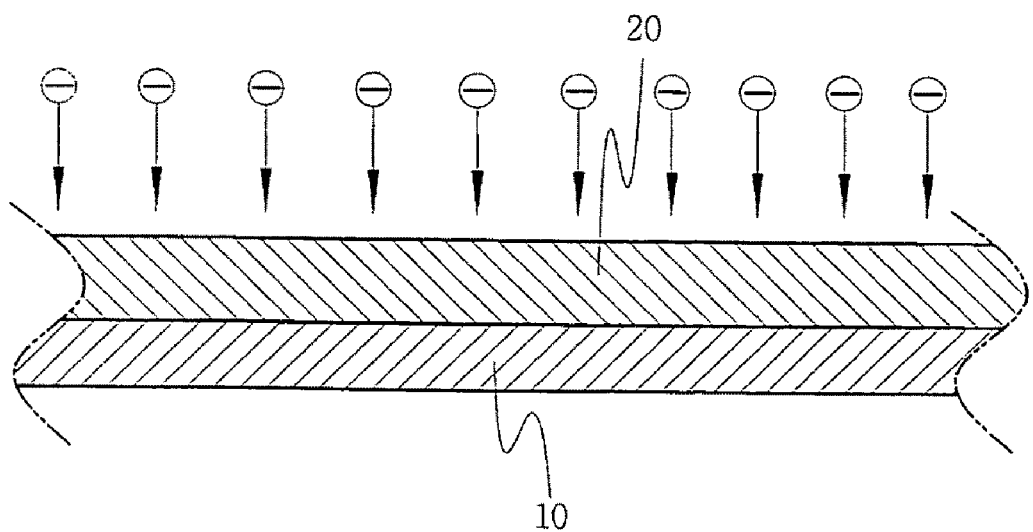

As shown in FIG. 2C, the amorphous silicon layer 20 is doped with an impurity, through an ion implantation through an upper part thereof. The impurity may be Ge, As, P and/or the like. In particular embodiments, the amorphous silicon layer 20 is doped by an implantation of Ge.

Figure 2D:
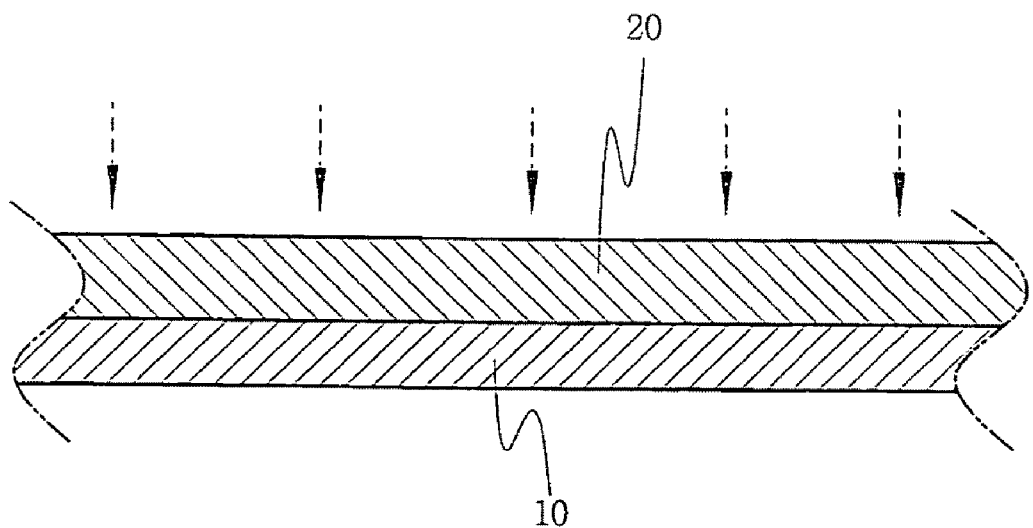

As illustrated in FIG. 2D, a laser beam is irradiated onto the amorphous silicon layer 20 having ions implanted therein through the ion implantation. As a result, in some embodiments, a phase change of the amorphous silicon layer 20 and transformation of its crystal structure proceed for only several nanoseconds. Thus, even though the amorphous silicon layer 20 is changed to a liquid phase, it may not flow from the seed layer 10.

A laser beam used to irradiate the amorphous silicon layer may have sufficient energy to melt the amorphous silicon layer 20 through to the interface with the seed layer 10. As such, the energy applied may vary based on a thickness of the amorphous silicon layer 20. Therefore a range for energy of the laser beam may not be limited. In particular embodiments, the laser beam has an energy capable of heating the amorphous silicon layer 20 to a temperature of about 1,410° C. The melting point of the amorphous silicon layer 20 is typically about 1,410° C.

The amorphous silicon layer 20 has a phase change induced by irradiation of a laser beam, but the seed layer 10 is not influenced due to a difference of absorption coefficient.

In some embodiments the irradiating laser beam is a gas laser, such as an eximer laser. Using the irradiating laser beam, the seed layer 10 and amorphous silicon layer 20 may be heated to a substantially uniform temperature to reduce a temperature gradient in the amorphous silicon layer 20 undergoing a phase change. For example, when reducing the temperature gradient of the amorphous silicon layer 20 undergoing the phase change, grains having a relatively larger size can be obtained. When a heating temperature (i.e., temperature of a chamber where laser heating is applied to the semiconductor device structure) is below about 200° C., there is typically a limitation in extending the size of grain. Also, when a heating temperature of the structure exceeds about 600° C., it may not be easy to arrange a heating unit. Thus, a heating temperature of the seed layer 10 and the amorphous silicon layer 20 during the irradiation thereof by the laser beam may be about 200° C. through about 600° C. in some embodiments. In some embodiments, it may be about 350° C. through about 450° C. In some embodiments, a heating temperature of about 400° C. is used. The amorphous silicon layer 20 may be scanned horizontally when the laser beam is irradiated thereon.

The irradiation by the laser beam produces a phase change of the amorphous silicon layer 20 by melting the amorphous silicon layer 20, thereby changing the amorphous silicon layer 20 into a liquid phase.

Figure 2E:
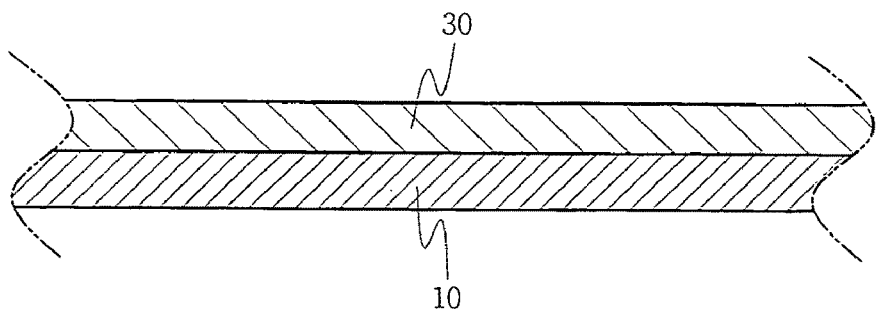

In particular, the phase change into a liquid phase in some embodiments is generated from the upper surface of amorphous silicon layer 20 to the interface with the seed layer 10 used as the selective epitaxial growth layer. When the phase change of the amorphous silicon layer 20 occurs, silicon material of the seed layer 10 acts as a seed and heat applied to the amorphous silicon layer 20 flows faster through to the seed layer 10, thereby changing the crystal structure of amorphous silicon layer 20 to a single-crystal silicon layer 30 as shown in FIG. 2E.

Thus, the amorphous silicon layer 20 subject to the laser beam becomes a single crystal, forming the single-crystal silicon layer 30 to provide a channel silicon layer. For the melting operation using the laser beam to make the amorphous silicon layer 20 a single crystal, through ion implantation the melting may flow (proceed) in a very fast speed through the seed layer 10 that acts as a seed to cool the layer 20, thereby more rapidly hardening an upper face of the amorphous silicon layer 20 to the single crystal structure. As a result, an ablation defect on the surface of the silicon layer 20 becoming a single crystal layer may be significantly improved and a flatness level of the surface may become relatively better by shortening a high-temperature maintenance time using the laser beam in crystallizing the amorphous silicon layer 20. That is, the single-crystal silicon layer 30 having the phase change through the crystallization may have a more uniform thickness of layer material, which may increase a manufacturing yield.

The surface of single-crystal silicon layer 30 providing a channel silicon layer may be finely planarized through chemical mechanical polishing (CMP) and then electrical devices, such as transistors, may be formed on the polished and planarized face.

Figure 2F:
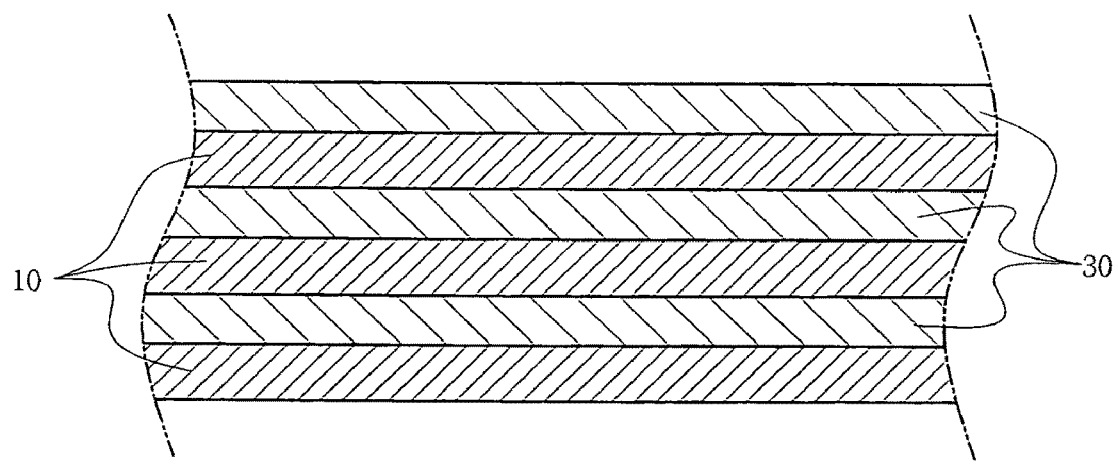

Furthermore, in some embodiments the single-crystal silicon layer 30 is used as a substrate, and an insulation layer is formed on the single-crystal silicon layer 30, including electrical devices, and a seed layer may be formed on the insulation layer. Such processes may be repeatedly performed, thereby obtaining a semiconductor device formed of plural layers 10, 30 as shown in FIG. 2F.

Further embodiments of the present invention will now be described with reference to FIGS. 3A to 3H. FIGS. 3A to 3H are enlarged cross sectional views of selected layers formed while manufacturing a semiconductor device according to some embodiments of the present invention.

Figure 3A:
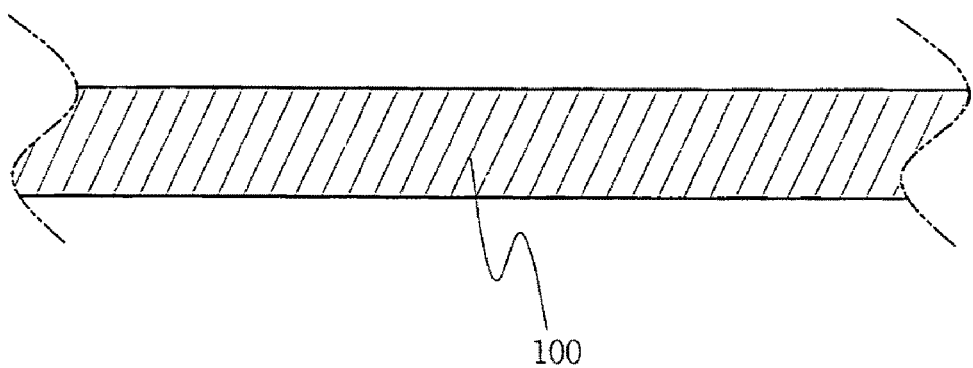
FIGS. 3A to 3H are enlarged cross sectional views illustrating methods of manufacturing a semiconductor device according to further embodiments of the present invention.
Figure 3B:
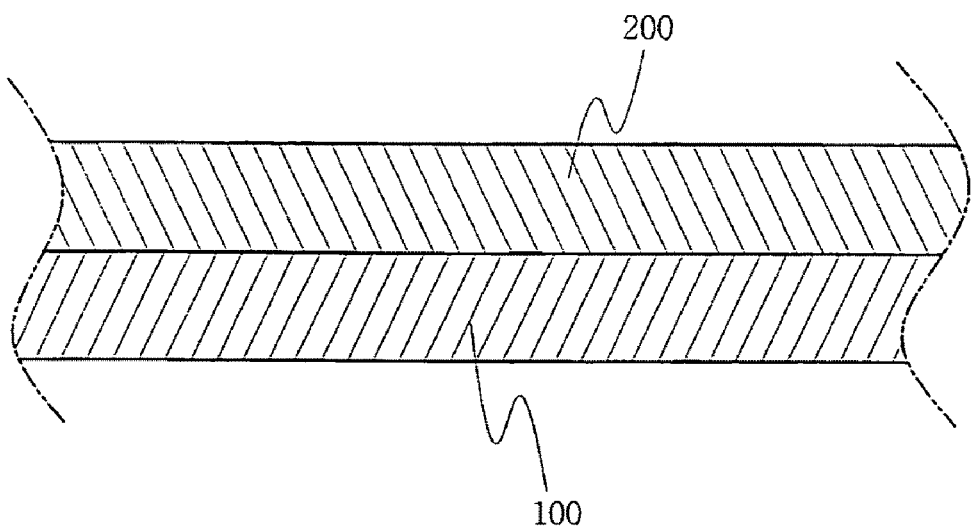
Figure 3C:
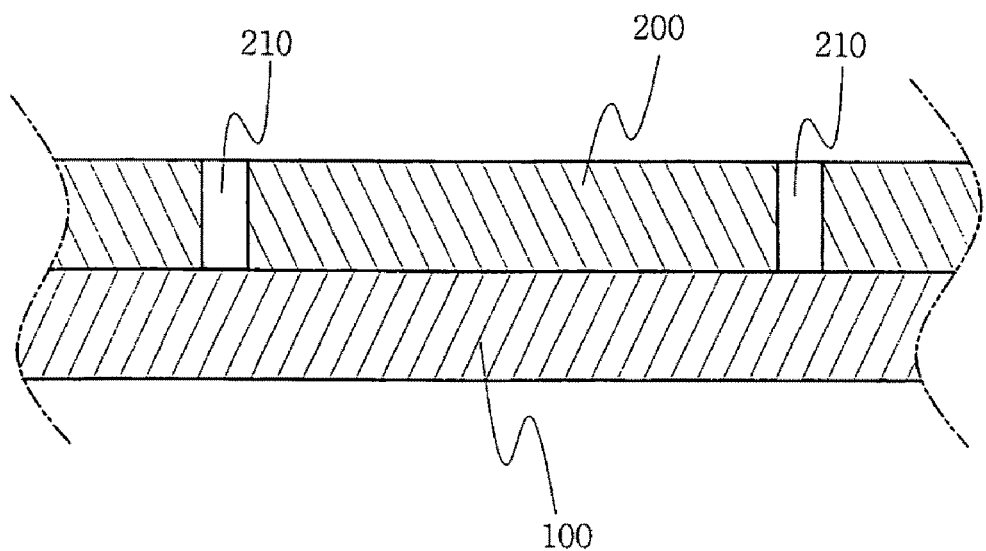

According to the illustrated embodiments, a single-crystal silicon substrate 100 is arranged as shown in FIG. 3A, and a first insulation layer 200 is formed on the single-crystal silicon substrate 100 as shown in FIG. 3B. The first insulation layer 200 is formed, for example, of an oxide layer containing oxide. On the first insulation layer 200, an etching process using a photoresist pattern as an etching mask is performed, thus forming a contact hole(s) 210 exposing the surface of the single-crystal silicon substrate 100 as shown in FIG. 3C.

Figure 3D:
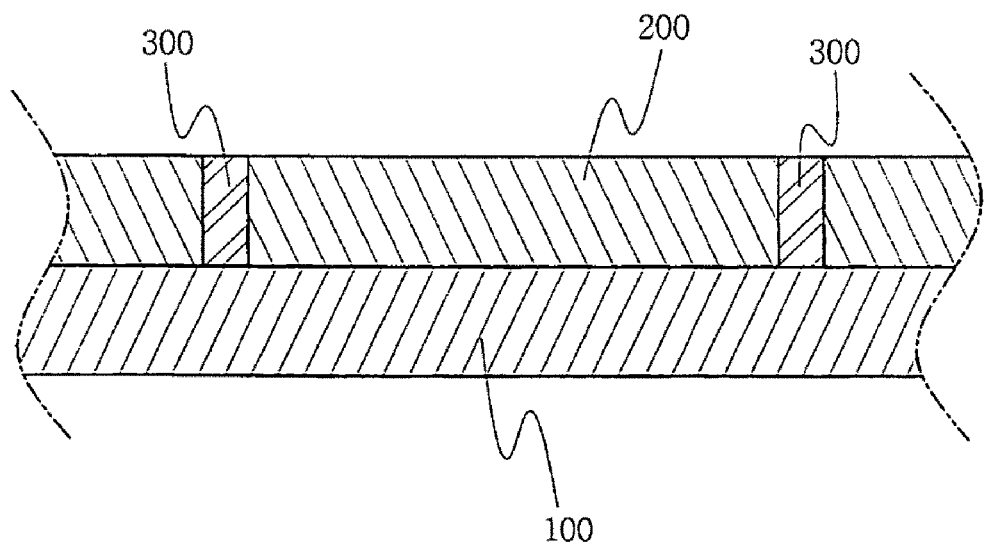

With reference to FIG. 3D, single crystal material having the same crystal structure as the single-crystal silicon substrate 100 is grown from the surface of single-crystal silicon substrate 100 exposed through the contact hole 210 through a selective epitaxial growth using a vapor phase epitaxy.

Material having a single crystal structure generally continuously grow, forming an epitaxial layer. The selective epitaxial growth for the formation of the epitaxial layer is progressed to an entrance of the contact hole 210, and so the contact hole 210 is filled with an epitaxial layer, thus forming a first seed contact 300 shown in FIG. 3D.

On the other hand, the selective epitaxial growth for the formation of first seed contact 300 may be obtained in some embodiments through various other processes, such as liquid phase epitaxy, vapor phase epitaxy, molecular beam epitaxy and/or the like. The selective epitaxial growth through vapor phase epitaxy is used in some particular embodiments.

The first seed contact 300 may be realized by using single-crystal silicon or single crystal germanium and may be obtained with single-crystal silicon through a selective epitaxial growth or signal crystal germanium and silicon-on-insulator or germanium-on-insulator insulator through selective epitaxial growth.

Figure 3E:
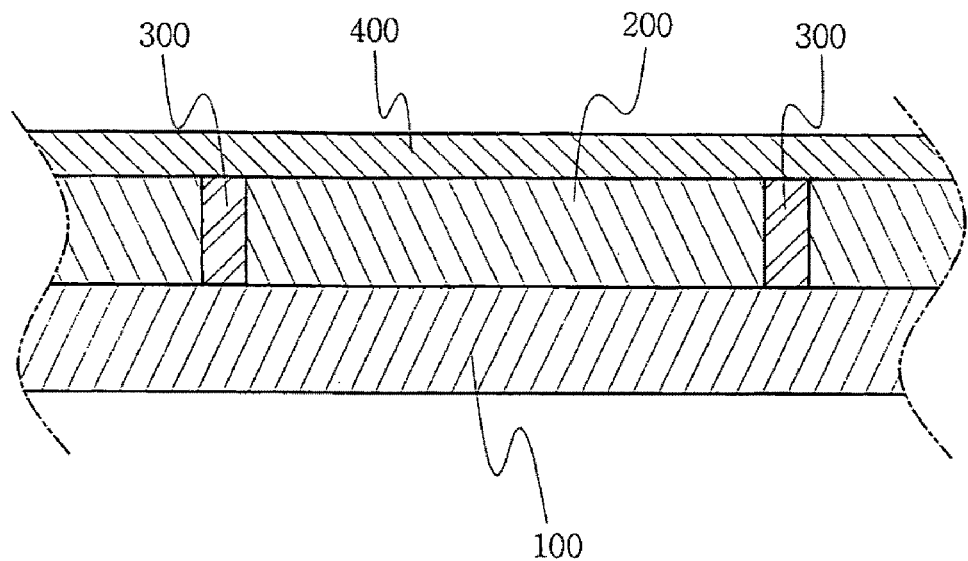

Amorphous silicon material is formed on the first insulation layer 200, including an upper face of first seed contact 300, as shown in the embodiments of FIG. 3E. The insulation layer formed on the first seed contact 300 forms a first amorphous silicon layer 400. The first amorphous silicon layer 400 in some embodiments is formed through the CVD, and may be formed to a thickness of about 500 Å to about 1000 Å. The first amorphous silicon layer 400 may be formed of polysilicon.

Figure 3F:
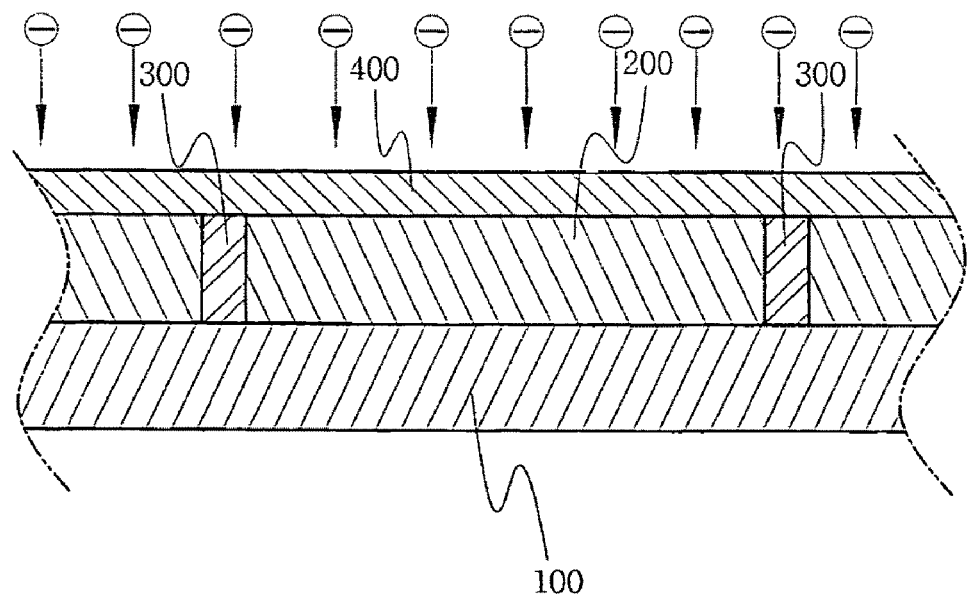

The first amorphous silicon layer 400 in the illustrated embodiments is doped with an impurity through an ion implantation from an upper part thereof as shown in FIG. 3F. The impurity may be, for example, Ge, As, P and/or the like. In some embodiments the implanted impurity is Ge.

Figure 3G:
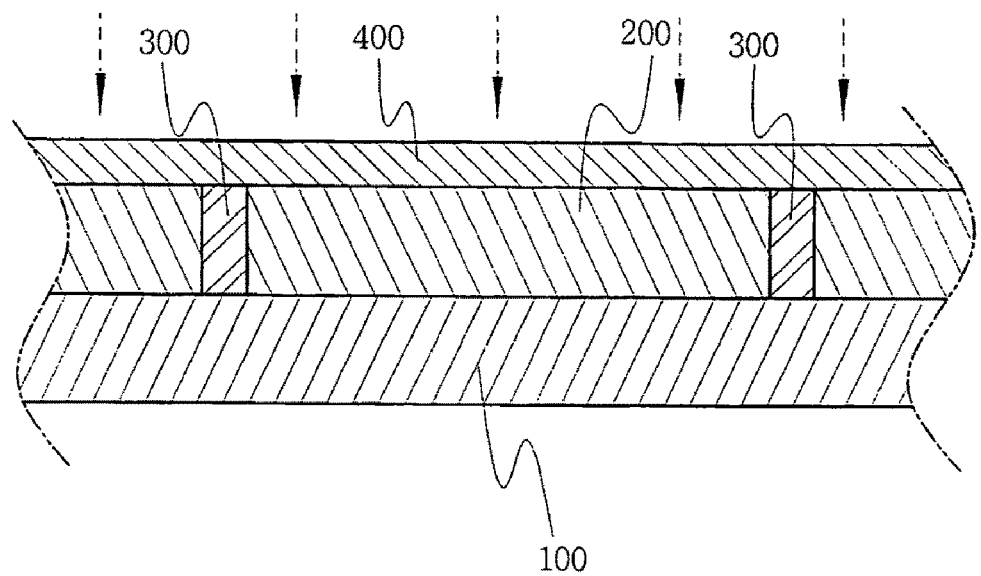
Figure 3H:
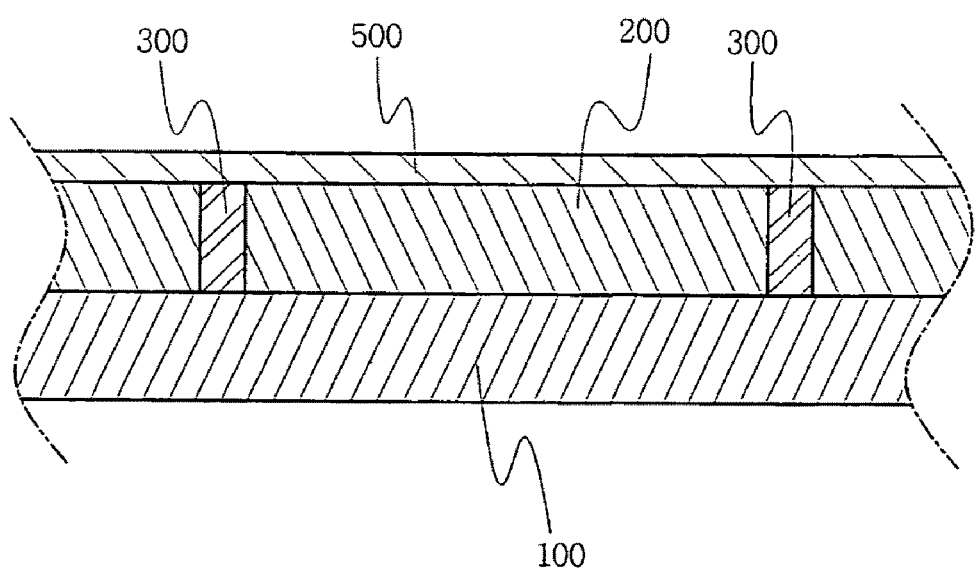

A laser beam is irradiated on the first amorphous silicon layer 400 having the ion implantation therein as shown in FIG. 3G. A phase change of the amorphous silicon layer 20 and transformation of crystal structure therein proceed over several nanoseconds in some embodiments. The laser beam in some embodiments has energy capable of melting the amorphous silicon layer 400 to change the surface of first amorphous silicon layer 400 through to the interface with the first seed contact 300. Thus, a different energy may be used based on a thickness of the first amorphous silicon layer 400.

A range of energy for the laser beam is generally not limited for the processes described herein. In some embodiments, a laser beam having an energy capable of providing a temperature of 1,410° C. or more as a melting point of first amorphous silicon layer 400 is used. The laser beam may be generated using an eximer laser or other type of gas laser.

The first amorphous silicon layer 400 has a phase change induced by irradiation of the laser beam, but the first seed contact 300 may be substantially not influenced due to a difference of absorption coefficient between the layer 400 and contact 300.

When irradiating the laser beam, the first seed contact 300 and the first amorphous silicon layer 400 may be heated by a uniform temperature to reduce a temperature gradient of the first amorphous silicon layer 400. When reducing the temperature gradient of the first amorphous silicon layer 400 during a phase change, grains of a relatively larger size can be obtained. When a heating temperature (of a chamber holding the substrate structure) is below about 200° C., there is a limit in the ability to so extend the size of grain. When the heating temperature of the structure exceeds about 600° C., it may not be easy to provide a heating unit. Thus, a heating temperature of the first seed contact 300 and the first amorphous silicon layer 400 during the irradiation with the laser beam in some embodiments may be about 200° C. through about 600° C. In some embodiments, the temperature may be between about 350° C. and about 450° C.

In further embodiments, the heating temperature is about 400° C. The first amorphous silicon layer 400 may be scanned horizontally when the laser beam is irradiated thereon.

The irradiation of the laser beam produces a phase change of the first amorphous silicon layer 400, and the first amorphous silicon layer 400 melts through the laser beam, thereby changing the first amorphous silicon layer 400 into a liquid phase.

In particular, phase change into a liquid phase is generated from the surface of first amorphous silicon layer 400 to the interface with the seed layer 300 as the selective epitaxial growth layer. When the phase change of first amorphous silicon layer 400 occurs, silicon material of the first seed contact 300 acts as a seed, thereby changing the crystal structure of first amorphous silicon layer 400 to a single crystal.

Therefore the first amorphous silicon layer 400 receiving the laser beam becomes a single crystal, forming a channel silicon layer, and thus the first amorphous silicon layer 400 becomes a first single-crystal silicon layer 500.

Heat in a melting operation using a laser beam into the amorphous silicon layer 400 becoming a single crystal, as a result of the ion implantation therein, may flow quickly through to the first seed contact 300. As a result, an ablation defect on the surface of silicon layer 40 may be improved and a flatness level of the layer may thereby be improved as a result of a shortening of a high-temperature maintenance time using the laser beam during crystallizing of the first amorphous silicon layer 400. In other words, the resulting first single-crystal silicon layer 500 having the phase change through the crystallization may have a more uniform thickness, which may increase manufacturing yield.

Figure 4A:
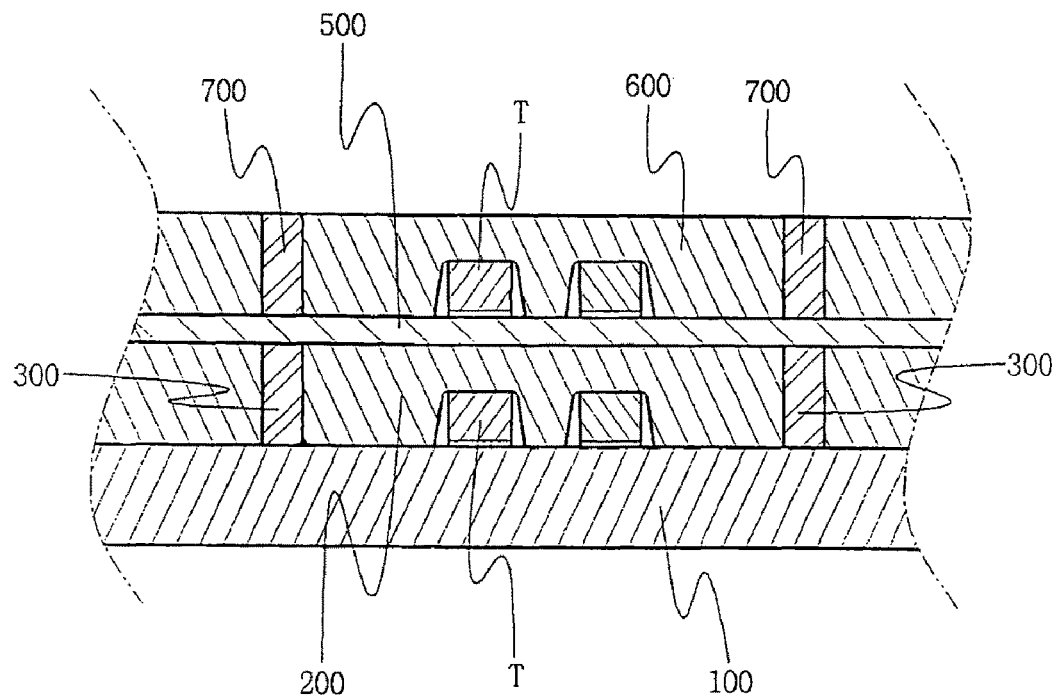
FIGS. 4A through 4D are cross sectional views of a semiconductor device illustrating methods of manufacturing a semiconductor device including electrical devices according to further embodiments of the present invention.
Figure 4B:
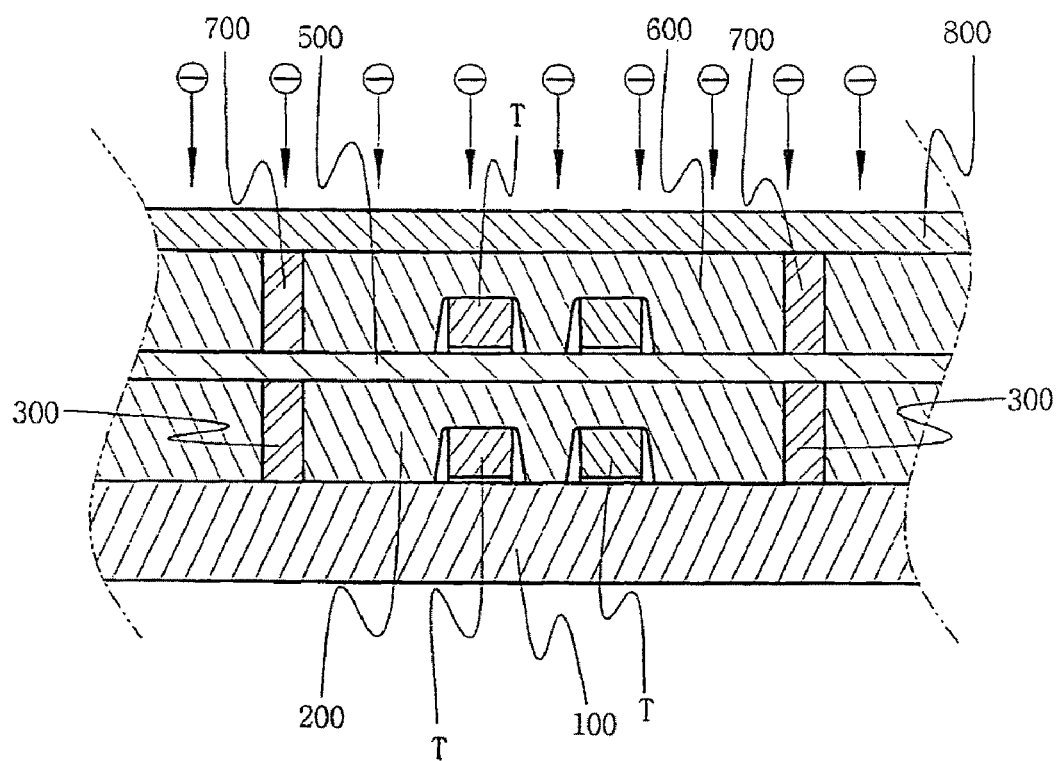

FIGS. 4A through 4D are side cross sectional views of a semiconductor device manufactured with a plurality of layers according to further embodiments of the present invention. In the illustrated embodiments, as with the embodiments of FIGS. 3A-3H, a single-crystal silicon substrate 100 is arranged and, on the single-crystal silicon substrate 100, an electrical device T, such as a transistor, is formed. A first insulation layer 200 is formed on an upper part of the single-crystal silicon substrate 100 that covers the electrical device T. A contact hole is formed vertically piercing through the first insulation layer 200 and a first seed contact 300 is formed through an epitaxial growth in the contact hole as seen in FIGS. 4A-4B.

Amorphous silicon material is formed using, for example, CVD, on the first insulation layer 200 including the first seed contact 300, thereby forming a first amorphous silicon layer and ion is implanted into the first amorphous silicon layer and a laser beam is irradiated thereon to form a first single-crystal silicon layer 500 through a phase change of first amorphous silicon layer. Such a structure may be formed in a manner similar to that described above.

As seen in FIGS. 4A-4B, an electrical device T is formed on the first single-crystal silicon layer 500 serving as a substrate. A second insulation layer 600 is formed covering the upper electrical device T on the first single-crystal silicon layer 500 as shown in FIG. 4A, and an etching process using a photoresist pattern as an etching mask is performed on the second insulation layer 600, thus forming a contact hole exposing the surface of first single-crystal silicon layer 500. A selective epitaxial growth through a vapor phase epitaxy is performed for the contact hole so that material having the same single crystal structure as the first single-crystal silicon layer 500 grows from the exposed surface of the first single-crystal silicon layer 500, thus forming an epitaxial layer. The epitaxial layer is formed up to an entrance of the contact hole so that the contact hole is filled with the epitaxial layer, thus forming a second seed contact 700.

On the second insulation layer 600 including the second seed contact 700, an amorphous silicon material is deposited using, for example, CVD, including on an upper face of the second seed contact 700 as shown in FIG. 4B, thereby forming a second amorphous silicon layer 800.

The deposited second amorphous silicon layer 800 is doped with an impurity through an ion implantation from an upper surface thereof as indicated graphically in FIG. 4B. The doped impurity may be Ge, As, P and/or the like. In some embodiments, the doped impurity is Ge.

Figure 4C:
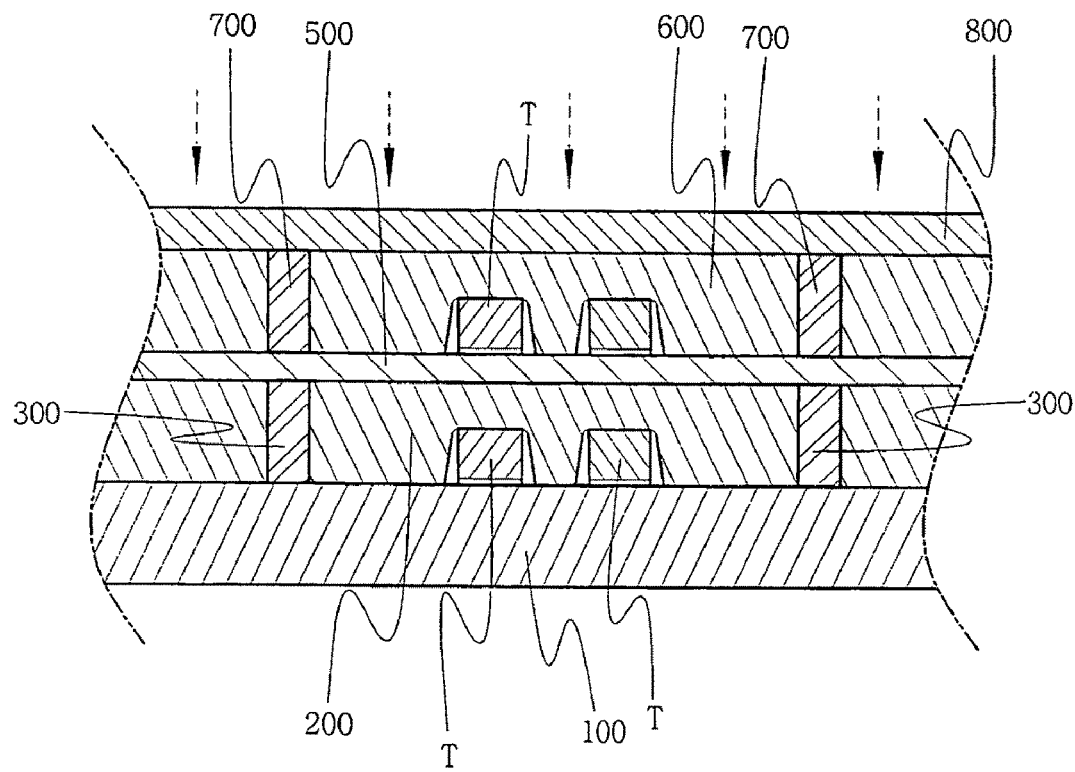
Figure 4D:
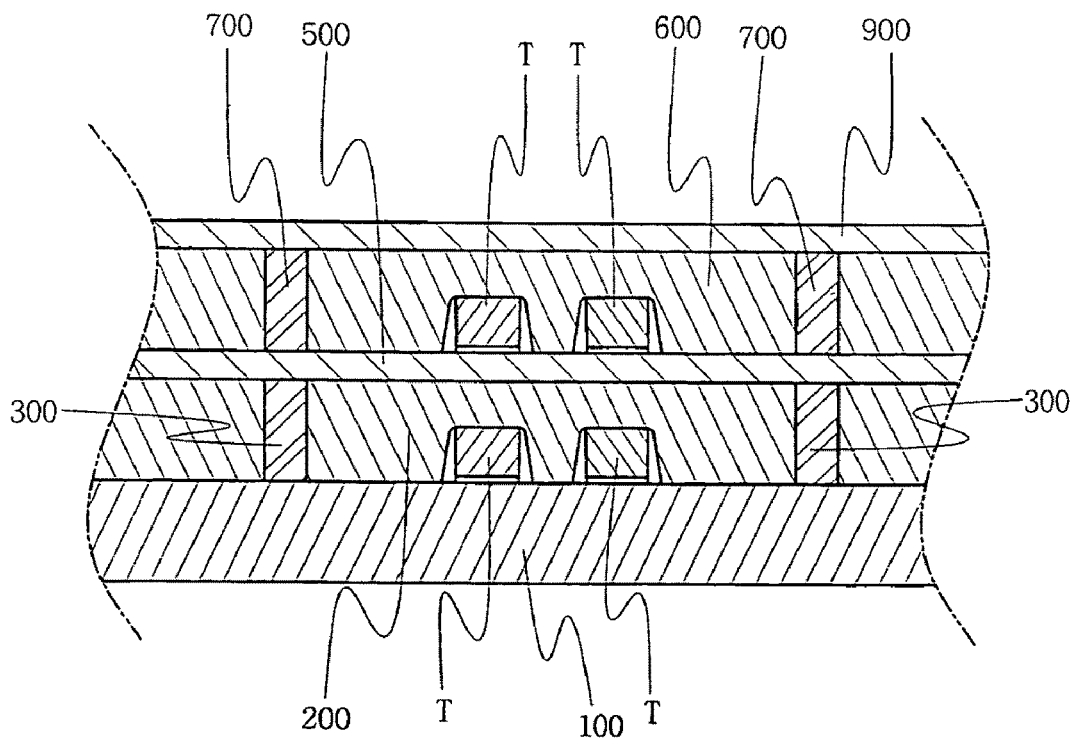

A laser beam is irradiated onto the second amorphous silicon layer 800 having the ion implanted therein as shown graphically in FIG. 4C. The laser beam may have energy capable of causing a resultant layer temperature of about 1,410° C. or more corresponding to a melting point of the second amorphous silicon layer 800. As a result, the second amorphous silicon layer 800 has a phase change caused by irradiation from the laser beam, but the second seed contact 700 may be substantially not influenced (limited temperature increase) due to a difference of absorption coefficient between the layer 800 and the contact 700.

The irradiating laser beam may be provided by an eximer laser or other type of gas laser. While irradiating with the laser beam, the second seed contact 700 and amorphous silicon layer 800 may be heated to a substantially uniform base temperature to reduce a temperature gradient in the second amorphous silicon layer 800. In other words, a heating temperature (i.e., chamber temperature setting the base temperature of the structure) of the second seed contact 700 and the second amorphous silicon layer 800 during irradiation with the laser beam may be about 200° C. to about 600° C. In some embodiments, the temperature may be about 350° C. to about 450° C. In further embodiments, the temperature may be about 400° C. The second amorphous silicon layer 800 may be scanned horizontally when irradiating with the laser beam.

A phase change is generated in the second amorphous silicon layer 800 through the irradiation of the laser beam. Thus, the second amorphous silicon layer 800 melts as its phase is changed into a liquid phase through to the interface with the second seed contact 700. While the phase change of the second amorphous silicon layer 800 occurs, the silicon material of the second seed contact 700 acts as a seed, thereby setting the changed crystal structure of the second amorphous silicon layer 800 to a single crystal structure. As a result the lower irradiated second amorphous silicon layer 800 is single-crystallized, forming a channel silicon layer shown in FIG. 4D as a single-crystal silicon layer 900.

In a state in which the second amorphous silicon layer 800 is melted, heat applied to the second amorphous silicon layer 800 may flow quickly therein through to the second seed layer 700, and an ablation defect on the surface of second single-crystal silicon layer 900 may be reduced so that a planarization level of the layer 800 may be improved from the shortening a high-temperature maintenance time while crystallizing the second amorphous silicon layer 800. Thus, the second single-crystal silicon layer 900 may have a substantially uniform thickness, which may increase a manufacturing yield.

The formation of the single-crystal silicon layer with reduced defects as described above may be followed by forming an electrical device thereon, for example, by using the formed single-crystal silicon layer as a substrate and repeating the above described sequence of processes thereon to manufacture a semiconductor device including a plurality of layers.

In some embodiments, an ion implantation process is performed before a laser beam is irradiated onto an amorphous silicon layer to form a single-crystal silicon substrate to be provided with an electrical device. Thus a heat flow speed through to an underlying seed contact may be increased while laser is inducing melting of the amorphous silicon layer, which may substantially shorten a high-temperature maintenance time of the amorphous silicon layer and reduce an ablation defect on an upper surface thereof as described above, which may provide a high manufacturing yield.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method for manufacturing a semiconductor device, comprising:
   forming a seed layer containing a silicon material on a substrate;
   forming an amorphous silicon layer containing amorphous silicon material on the seed layer;
   doping the amorphous silicon layer with an impurity; and
   irradiating a laser beam onto the doped amorphous silicon layer to produce a phase change of the amorphous silicon layer and change the amorphous silicon layer into a single-crystal silicon layer based on the seed layer.

2. The method of claim 1, wherein:
   forming the seed layer comprises forming the seed layer through a selective epitaxial growth process; and
   doping the amorphous silicon layer with an impurity comprises doping the amorphous silicon layer through an ion implantation on an upper face of the amorphous silicon layer.

3. The method of claim 1, wherein doping the amorphous silicon layer with an impurity comprises doping the amorphous silicon layer with an impurity that increases a rate of heat transfer through the amorphous silicon layer.

4. The method of claim 1, wherein the seed layer has a different absorption coefficient than the amorphous silicon layer and wherein irradiating the laser beam onto the doped amorphous silicon layer includes heating the doped amorphous silicon layer to a temperature exceeding a melting point temperature of the doped amorphous silicon layer while a temperature of the seed layer is substantially unchanged as a result of the different absorption coefficient of the seed layer.

5. The method of claim 2, wherein the selective epitaxial growth process comprises vapor phase epitaxy.

6. The method of claim 2, wherein forming the seed layer comprises forming the seed layer of a single single-crystal silicon material and wherein doping the amorphous silicon layer comprises doping the amorphous silicon layer with Ge.

7. The method of claim 2, wherein the amorphous silicon layer comprises a polysilicon.

8. The method of claim 2, wherein irradiating a laser beam onto the doped amorphous silicon layer includes heating the substrate including the seed layer and the doped amorphous silicon layer to a temperature of about 350° C. to about 450° C. while irradiating the laser beam onto the doped amorphous silicon layer.

9. The method of claim 2, wherein doping the amorphous silicon layer comprises doping the amorphous silicon layer with Ge, As and/or P.

10. A method for manufacturing a semiconductor device, the method comprising:
    providing a single-crystal silicon substrate;
    forming an insulation layer on the single-crystal silicon substrate, the insulation layer including a contact hole exposing a surface of the single-crystal silicon substrate;
    forming a seed contact containing a silicon material in the contact hole;
    forming an amorphous silicon layer containing an amorphous silicon material on an upper face of the insulation layer including the seed contact;
    doping the amorphous silicon layer with an impurity; and
    irradiating a laser beam onto the doped amorphous silicon layer to provide a phase change of the amorphous silicon layer and change the amorphous silicon layer into a single-crystal silicon layer based on the seed contact.

11. The method of claim 10, wherein:
    forming the seed contact comprises forming the seed contact through a selective epitaxial growth process; and
    doping the amorphous silicon layer with an impurity comprises doping the amorphous silicon layer through an ion implantation on an upper face of the amorphous silicon layer.

12. The method of claim 11, wherein:
    the selective epitaxial growth process comprises vapor phase epitaxy,
    doping the amorphous silicon layer comprises doping the amorphous silicon layer with Ge;
    the amorphous silicon layer comprises a polysilicon; and
    irradiating a laser beam onto the doped amorphous silicon layer includes heating the substrate including the seed layer and the doped amorphous silicon layer to a temperature of about 350° C. to about 450° C. while irradiating the laser beam onto the doped amorphous silicon layer.

13. The method of claim 11, wherein forming the insulation layer is preceded by forming an electrical device on the single-crystal silicon substrate.

14. The method of claim 13, wherein the insulation layer comprises a first insulation layer, the seed contact comprises a first seed contact, the amorphous silicon layer comprises a first amorphous silicon layer and the single-crystal silicon layer comprises a first single-crystal silicon layer and wherein the method further comprises:
    forming an upper electrical device on the first single-crystal silicon layer;
    forming a second insulation layer on the first single-crystal silicon layer including the upper electrical device;
    forming a contact hole in the second insulation layer that exposes an upper surface of the first single-crystal silicon layer;
    forming a second seed contact containing a silicon material in the contact hole in the second insulation layer through a selective epitaxial growth process;
    forming a second amorphous silicon layer containing an amorphous silicon material on an upper face of the second insulation layer including the second seed contact;
    doping the second amorphous silicon layer with an impurity through an ion implantation of doping impurity on an upper face of the second amorphous silicon layer; and
    irradiating a laser beam onto the doped second amorphous silicon layer to provide a phase change of the second amorphous silicon layer and change the second amorphous silicon layer into a second single-crystal silicon layer.

15. The method of claim 14, wherein the selective epitaxial growth process comprises vapor phase epitaxy.

16. The method of claim 14, wherein forming the second seed layer comprises forming the second seed layer of a single single-crystal silicon material and wherein doping the second amorphous silicon layer comprises doping the second amorphous silicon layer with Ge.

17. The method of claim 14, wherein the second amorphous silicon layer comprises a polysilicon.

18. The method of claim 14, wherein irradiating a laser beam onto the doped second amorphous silicon layer includes heating the substrate including the second seed layer and the second doped amorphous silicon layer to a temperature of about 350° C. to about 450° C. while irradiating the laser beam onto the second doped amorphous silicon layer.

19. The method of claim 18, wherein irradiating a laser beam onto the doped second amorphous silicon layer includes heating the substrate including the second seed layer and the second doped amorphous silicon layer to a temperature of about 400° C. while irradiating the laser beam onto the second doped amorphous silicon layer.

20. The method of claim 14, wherein irradiating a laser beam comprises scanning the second doped amorphous silicon layer horizontally.

21. The method of claim 14, wherein doping the second amorphous silicon layer comprises doping the second amorphous silicon layer with Ge, As and/or P.

* * * * *